(12) United States Patent
Zhang et al.

(10) Patent No.: US 11,131,641 B2
(45) Date of Patent: Sep. 28, 2021

(54) METHOD FOR MEASURING OIL CONTENT OF LITHIUM BATTERY SEPARATOR BY USING DSC

(71) Applicant: JIANGSU HORIZON NEW ENERGY TECH CO., LTD., Changzhou (CN)

(72) Inventors: Yeqing Zhang, Changzhou (CN); Xingxing Weng, Changzhou (CN); Cheng Jin, Changzhou (CN); Zhaohui Chen, Changzhou (CN)

(73) Assignee: JIANGSU HORIZON NEW ENERGY TECH CO., LTD., Changzhou (CN)

( * ) Notice: Subject to any disclaimer, the term of this patent is extended or adjusted under 35 U.S.C. 154(b) by 0 days.

(21) Appl. No.: 17/058,157

(22) PCT Filed: May 21, 2020

(86) PCT No.: PCT/CN2020/091474
§ 371 (c)(1),
(2) Date: Nov. 24, 2020

(87) PCT Pub. No.: WO2021/051847
PCT Pub. Date: Mar. 25, 2021

(65) Prior Publication Data
US 2021/0247338 A1 Aug. 12, 2021

(30) Foreign Application Priority Data
Sep. 19, 2019 (CN) .......................... 201910889866.5

(51) Int. Cl.
*G01N 25/20* (2006.01)
*H01M 10/0525* (2010.01)
(Continued)

(52) U.S. Cl.
CPC ............. *G01N 25/20* (2013.01); *G01K 7/425* (2013.01); *G01N 25/005* (2013.01);
(Continued)

(58) Field of Classification Search
CPC .. G01N 25/20; G01N 25/005; G01N 25/4866; G01N 25/18; G01N 25/201; G01N 25/4893
(Continued)

(56) References Cited

U.S. PATENT DOCUMENTS 8,433,443 B2 * 4/2013 Hagerty .................. C08F 10/00
700/269
8,452,548 B2 * 5/2013 Gould .................... G01N 33/30
702/30
(Continued)

FOREIGN PATENT DOCUMENTS

CN 103837566 A 6/2014
CN 104237150 A 12/2014
(Continued)

OTHER PUBLICATIONS

Fabien, "Study of the combined roles of the Silica/Oil/UHMWPE formulation and process parameters on morphological and electrical properties of battery Separators", May 23, 2017 (Year: 2017).*
(Continued)

*Primary Examiner* — Ibrahime A Abraham
*Assistant Examiner* — Chris Q Liu
(74) *Attorney, Agent, or Firm* — Bayramoglu Law Offices LLC

(57) ABSTRACT

A method for measuring the oil content of a lithium battery separator by using DSC includes the following steps: taking 5-10 mg of an oil-containing separator sample from the lithium battery separator, and taking 5-10 mg of an oil-free separator sample from an oil-free separator; performing an
(Continued)

enthalpy test on the oil-free separator sample at room temperature by using a differential scanning calorimeter to obtain a first enthalpy value, and performing an enthalpy test on the oil-containing separator sample by using the differential scanning calorimeter to obtain a second enthalpy value; subtracting the second enthalpy value from the first enthalpy value to obtain a difference, and then dividing the difference by the first enthalpy value to obtain the oil content of the oil-containing separator sample.

10 Claims, 1 Drawing Sheet

(51) Int. Cl.
  *H01M 50/411*  (2021.01)
  *G01K 7/42*  (2006.01)
  *G01R 31/36*  (2020.01)
  *G01N 25/00*  (2006.01)
  *G01N 25/48*  (2006.01)
  *H01M 50/403*  (2021.01)
  *G01N 11/00*  (2006.01)

(52) U.S. Cl.
  CPC ..... *G01N 25/4866* (2013.01); *G01N 25/4873* (2013.01); *G01N 25/4893* (2013.01); *G01R 31/36* (2013.01); *H01M 50/411* (2021.01); *G01N 2011/0093* (2013.01); *H01M 10/0525* (2013.01); *H01M 50/403* (2021.01)

(58) Field of Classification Search
  USPC .................. 702/136, 63, 32; 374/10, 43, 31
  See application file for complete search history.

(56) References Cited

U.S. PATENT DOCUMENTS

2014/0012534 A1* 1/2014 Prest .................... G01N 25/005
                      702/136
2017/0299532 A1* 10/2017 Patil ................... G01N 25/4886

FOREIGN PATENT DOCUMENTS

| CN | 109073577 A | 12/2018 | |
|---|---|---|---|
| CN | 110726750 A | 1/2020 | |
| EP | 2482062 A1 * | 8/2012 | ......... G01N 25/4833 |
| EP | 2482062 A1 | 8/2012 | |
| WO | 2010030354 A1 | 3/2010 | |

OTHER PUBLICATIONS

Li Li-Qiong et al., Determination of trace water in materials of thermal battery by differential scanning calorimetry, Chinese Journal of Power Sources, 2002, pp. 301-302, vol. 26, No. 4.

* cited by examiner

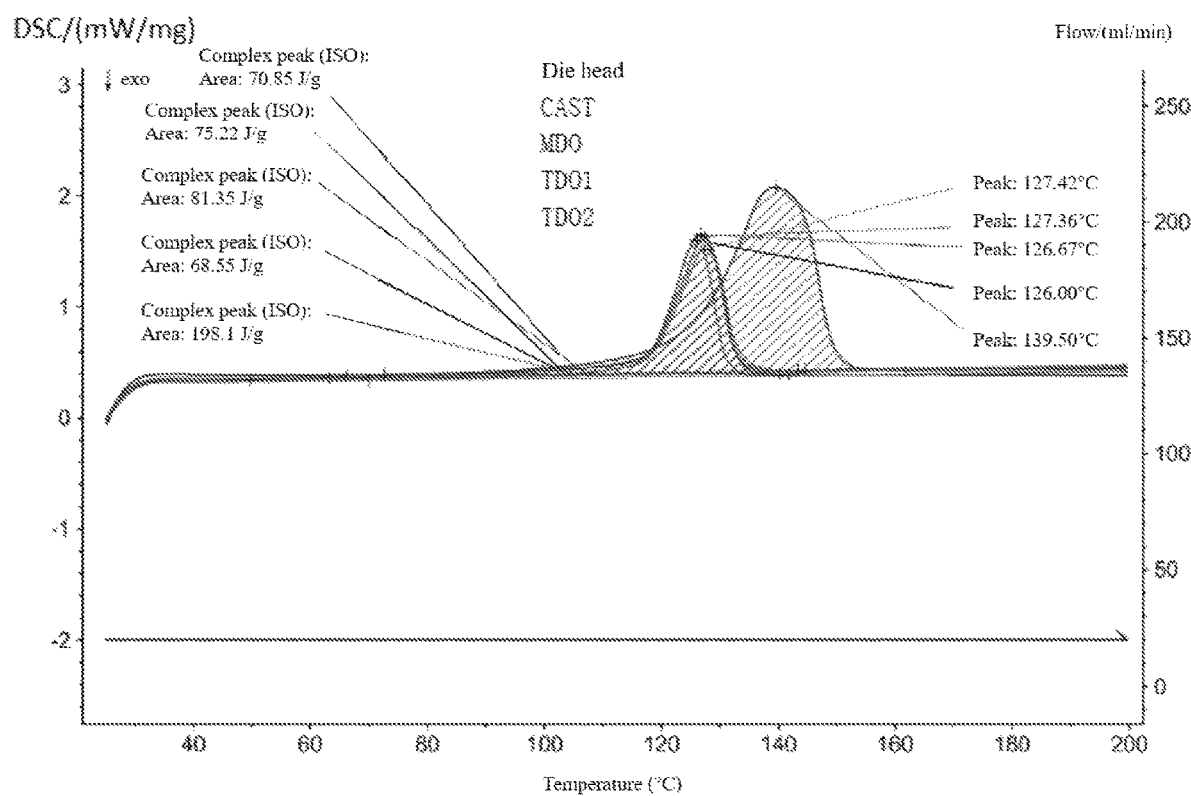

METHOD FOR MEASURING OIL CONTENT OF LITHIUM BATTERY SEPARATOR BY USING DSC

CROSS REFERENCE TO THE RELATED APPLICATIONS

This application is the national phase entry of International Application No. PCT/CN2020/091474, filed on May 21, 2020, which is based upon and claims priority to Chinese Patent Application No. 201910889866.5, filed on Sep. 19, 2019, the entire contents of which are incorporated herein by reference.

TECHNICAL FIELD

The present invention relates to the measurement of the oil content of a lithium battery separator, and more particularly, to a method for measuring the oil content of a lithium battery separator by using differential scanning calorimetry (DSC).

BACKGROUND

Currently, microporous membranes used as separators are prepared by a dry method and a wet method. The dry method is known as melt-spinning and cold-stretching (MSCS), while the wet method is known as thermally induced phase separation (TIPS). The process of TIPS includes: dissolving a polymer into a solvent (mineral oil) with a high boiling point and low volatility at elevated temperature to form a homogeneous solution, cooling the homogeneous solution to induce liquid-solid phase separation or liquid-liquid phase separation in the solution, extracting the solvent (mineral oil) with the high boiling point by a volatile reagent (dichloromethane), and drying the polymer to obtain a macromolecular microporous membrane with a certain structure and shape. The extraction of mineral oil is critical to the quality of the membrane. For example, if the mineral oil is not thoroughly extracted, then the porosity and air permeability of the separator is directly affected, thereby affecting the internal resistance and circulation performance of the battery. The measurement of the mineral oil content of the separator, therefore, has become a routine measurement item in practice.

In the lithium battery industry, the separator is routinely tested through an ultrasonic cleaner for measuring the mineral oil content thereof, and dichloromethane is used as the extractant to extract the mineral oil in the separator. After being dried in a dryer, the separator is weighed to obtain the mineral oil content. This method, on the one hand, has low testing efficiency due to the longer time required for the extraction of the mineral oil by dichloromethane and the drying of the separator in the dryer. On the other hand, the highly volatile dichloromethane during the extraction of the mineral oil causes environmental contamination.

SUMMARY

To overcome the above-mentioned problems, the present invention provides a method for measuring the oil content of the lithium battery separator by using DSC. Compared with the prior art, this method improves the testing efficiency of the oil content of the lithium battery separator and is more environmentally friendly.

The present invention provides a method for measuring the oil content of a lithium battery separator by using DSC, which includes the following steps: taking 5-10 mg of an oil-containing separator sample from the lithium battery separator, taking 5-10 mg of an oil-free separator sample from an oil-free separator, and performing an enthalpy test on the oil-free separator sample at room temperature by using a differential scanning calorimeter to obtain a first enthalpy value; performing first heating on the oil-containing separator sample from the room temperature to a temperature of 160-240° C. at a heating rate of 3-30 K/min, maintaining the temperature for 5-15 min, and then cooling the oil-containing separator sample to the room temperature at a cooling rate of 3-30 K/min; performing second heating on the oil-containing separator sample from the room temperature to the temperature of 160-240° C. at a heating rate of 3-30 K/min, and then naturally cooling the oil-containing separator sample to the room temperature; performing an enthalpy test on the oil-containing separator sample by using the differential scanning calorimeter to obtain a second enthalpy value, subtracting the second enthalpy value from the first enthalpy value to obtain a difference, and then dividing the difference by the first enthalpy value to obtain the oil content of the oil-containing separator sample.

Further, the weight of the oil-containing separator sample is equal to the weight of the oil-free separator sample.

Further, the heating rate of the first heating is 10 K/min, and the heating time of the first heating is 17.5 min.

Further, the cooling rate after the first heating is 20 K/min.

Further, the heating rate of the second heating is 10 K/min, and the heating time of the second heating is 17.5 min.

Further, the room temperature is 25° C.

The method for measuring the oil content of the lithium battery separator by using DSC according to the present invention specifically includes the following steps: preparing the oil-containing separator sample and the oil-free separator sample of the same weight, performing an enthalpy test on the oil-free separator sample at room temperature by using the differential scanning calorimeter to obtain the first enthalpy value, heating the oil-containing separator sample twice, performing an enthalpy test on the oil-containing separator sample by using the differential scanning calorimeter to obtain the second enthalpy value, subtracting the second enthalpy value from the first enthalpy value to obtain a difference, and dividing the difference by the first enthalpy value to obtain the oil content of the oil-containing separator sample. This method is contamination-free during the test, and is time-saving.

Therefore, compared with the prior art, the method of the present invention improves the testing efficiency of the oil content of the lithium battery separator and is more environmentally friendly.

BRIEF DESCRIPTION OF THE DRAWINGS

The detailed description of the preferred embodiments below clearly shows the advantages and superiority of the present invention to those of ordinary skill in the art. The drawings are only used to illustrate the preferred embodiments, and should not be construed as limiting the present invention. In addition, throughout the drawings, the same reference designators are used to denote the same components.

FIGURE is a graph showing curves of the enthalpy values obtained from the differential scanning calorimeter during the measurement process.

DETAILED DESCRIPTION OF THE EMBODIMENTS

In order to clearly illustrate the technical solutions in the embodiments of the present invention, the experimental process is described in detail hereinafter. Specifically, a conventional separator with a thickness of 12 μm and a porosity of 40% is selected, then the oil content of the separator in different processes, including die head (fetching the separator from the die head for DSC), cast, machine direction orientation (MDO), transverse direction orientation (TDO)1, and TDO2, is measured by two methods, which are compared as the following.

(1) Traditional Method

A separator with a weight m1 is ultrasonically cleaned in an ultrasonic cleaner (power: 300 W) with dichloromethane for 20 min. During the ultrasonic cleaning process, the separator is shaken constantly by using a tweezer. After 20 min, the separator is again ultrasonically cleaned in the ultrasonic cleaner (power: 300 W) with new dichloromethane for 10 min to extract the mineral oil in the separator thoroughly. After being cleaned 2 times, the separator is removed from the ultrasonic cleaner by using the tweezer, and placed in a watch glass. Then, the separator is placed and dried in a dryer at a temperature of 70° C. for 20 min. When the time is up, the separator is fetched from the dryer, and then cooled in a crucible for 10 min. Subsequently, the separator is weighed by using a scale to obtain its weight m2. The difference between m1 and m2 is the weight of the mineral oil, such that the content of the mineral oil can be obtained.

(2) The Method of the Present Invention 5-10 mg of an oil-containing separator sample is taken from the lithium battery separator, and 5-10 mg of an oil-free separator sample is taken from an oil-free separator. An enthalpy test is performed on the oil-free separator sample at room temperature by using a differential scanning calorimeter to obtain a first enthalpy value. First heating is performed on the oil-containing separator sample from the room temperature to a temperature of 160-240° C. at a heating rate of 3-30 K/min. The temperature is maintained for 5-15 min, and then the oil-containing separator sample is cooled to the room temperature at a cooling rate of 3-30 K/min. Second heating is performed on the oil-containing separator sample from room temperature to the temperature of 160-240° C. at a heating rate of 3-30 K/min, and then the oil-containing separator sample is naturally cooled to room temperature. An enthalpy test is performed on the oil-containing separator sample by using the differential scanning calorimeter to obtain a second enthalpy value, the second enthalpy value is subtracted from the first enthalpy value to obtain a difference, and then the difference is divided by the first enthalpy value to obtain the oil content of the oil-containing separator sample.

TABLE 2

| No. | Process | Original separator weight (g) | Enthalpy (J/g) | Blank enthalpy (J/g) | White oil content (%) | Total duration (min) |
|---|---|---|---|---|---|---|
| 1 | Die head | 0.0086 | 70.85 | 198.7 | 64.34% | 54 |
| 2 | CAST | 0.0074 | 75.22 | 198.7 | 62.14% | 54 |
| 3 | MDO | 0.0068 | 81.35 | 198.7 | 59.06% | 54 |
| 4 | TDO1 | 0.0092 | 68.55 | 198.7 | 65.50% | 54 |
| 5 | TDO2 | 0.0062 | 198.1 | 198.7 | 0.30% | 54 |

Table 1 and Table 2 show the results of the two test methods. Specifically, Table 1 shows the test data obtained by using the traditional method to detect the oil content of the lithium battery separator according to the embodiment of the present invention, and Table 2 shows the test data obtained by using DSC to detect the oil content of the lithium battery separators according to the embodiment of the present invention. FIGURE is a graph showing curves of the enthalpy values obtained from the differential scanning calorimeter during the measurement process.

Obviously, those skilled in the art can make various modifications and changes to the present invention without departing from the spirit and scope of the present invention. Therefore, if these modifications and changes of the present invention fall within the scope of the claims of the present invention and their equivalent technologies, the present invention is also intended to include these modifications and changes.

TABLE 1

| No. | Process | Original separator weight (g) | Extraction time (min) | Drying temperature (° C.) | Drying time (min) | Cooling time (min) | Weight after extraction (g) | White oil content (%) | Total duration (min) |
|---|---|---|---|---|---|---|---|---|---|
| 1 | Die head | 1.363 | 30 | 70 | 20 | 10 | 0.488 | 64.20% | 75 |
| 2 | CAST | 0.922 | 30 | 70 | 20 | 10 | 0.348 | 62.26% | 75 |
| 3 | MDO | 0.797 | 30 | 70 | 20 | 10 | 0.326 | 59.10% | 75 |
| 4 | TDO1 | 0.657 | 30 | 70 | 20 | 10 | 0.228 | 65.30% | 75 |
| 5 | TDO2 | 0.294 | 30 | 70 | 20 | 10 | 0.293 | 0.34% | 75 |

What is claimed is:

1. A method for measuring an oil content of a lithium battery separator by using DSC, comprising the following steps:

taking 5-10 mg of an oil-containing separator sample from the lithium battery separator, taking 5-10 mg of an oil-free separator sample from an oil-free separator, and performing an enthalpy test on the oil-free separator sample at room temperature by using a differential scanning calorimeter to obtain a first enthalpy value;

performing first heating on the oil-containing separator sample from the room temperature to a temperature of 160-240° C. at a heating rate of 3-30 K/min, maintaining the temperature for 5-15 min, and then cooling the oil-containing separator sample to the room temperature at a cooling rate of 3-30 K/min; and performing second heating on the oil-containing separator sample from the room temperature to the temperature of 160-240° C. at the heating rate of 3-30 K/min, and then naturally cooling the oil-containing separator sample to the room temperature;

performing an enthalpy test on the oil-containing separator sample by using the differential scanning calorimeter to obtain a second enthalpy value, subtracting the second enthalpy value from the first enthalpy value to obtain a difference, and then dividing the difference by the first enthalpy value to obtain the oil content of the oil-containing separator sample.

2. The method according to claim 1, wherein, a weight of the oil-containing separator sample is equal to a weight of the oil-free separator sample.

3. The method according to claim 2, wherein, the heating rate of the first heating is 10 K/min, and a heating time of the first heating is 17.5 min.

4. The method according to claim 3, wherein, the cooling rate after the first heating is 20 K/min.

5. The method according to claim 4, wherein, the heating rate of the second heating is 10 K/min, and a heating time of the second heating is 17.5 min.

6. The method according to claim 5, wherein, the room temperature is 25° C.

7. The method according to claim 4, wherein, the room temperature is 25° C.

8. The method according to claim 3, wherein, the room temperature is 25° C.

9. The method according to claim 2, wherein, the room temperature is 25° C.

10. The method according to claim 1, wherein, the room temperature is 25° C.

* * * * *